(12) United States Patent
Hu et al.

(10) Patent No.: US 11,366,332 B2
(45) Date of Patent: Jun. 21, 2022

(54) MINI-INTERCONNECT CAPACITOR

(71) Applicant: Apple Inc., Cupertino, CA (US)

(72) Inventors: Christopher Hu, San Jose, CA (US); Ahmed Rashid, San Francisco, CA (US); Colleen F. Mischke, Sunnyvale, CA (US); Peng Chen, Fremont, CA (US); Talisa Mohammad Nejad, Cupertino, CA (US); Xiao Hu, Cupertino, CA (US); Yazan Z. Alnahhas, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 419 days.

(21) Appl. No.: 16/702,639

(22) Filed: Dec. 4, 2019

(65) Prior Publication Data

US 2020/0292839 A1   Sep. 17, 2020

Related U.S. Application Data

(60) Provisional application No. 62/819,602, filed on Mar. 17, 2019.

(51) Int. Cl.
| | |
|---|---|
| *G02B 27/42* | (2006.01) |
| *G01R 27/26* | (2006.01) |
| *H01G 4/005* | (2006.01) |

(52) U.S. Cl.
CPC ....... *G02B 27/425* (2013.01); *G01R 27/2605* (2013.01); *H01G 4/005* (2013.01)

(58) Field of Classification Search
CPC ...... G02B 27/425; G02B 5/18; G02B 5/1814; G02B 27/42; G02B 27/44; G01R 27/2605; G01R 27/26; H01G 4/005; H01G 4/08; H01G 4/06; H01G 4/14; H01G 4/38; H01G 4/385; H01G 4/40
USPC ........ 359/558, 566, 569, 573; 324/649, 658, 324/659, 663, 665, 666, 672, 673, 679, 324/680, 684, 685, 686
See application file for complete search history.

(56) References Cited

U.S. PATENT DOCUMENTS

| | | | |
|---|---|---|---|
| 7,616,116 B2 | 11/2009 | Ehrensvard et al. | |
| 9,740,888 B1 | 8/2017 | Aga et al. | |
| 9,780,554 B2 | 10/2017 | Kardassakis et al. | |
| 10,174,931 B2 | 1/2019 | Sawyer et al. | |
| 2011/0254567 A1* | 10/2011 | Gehrig | G01R 17/16 324/663 |
| 2014/0239984 A1* | 8/2014 | Alameh | G01D 5/24 324/686 |

(Continued)

*Primary Examiner* — Arnel C Lavarias
(74) *Attorney, Agent, or Firm* — Kligler & Associates Patent Attorneys Ltd

(57) ABSTRACT

An optical module includes an enclosure and an optical output assembly mounted on the enclosure. An emitter mounted in the enclosure is configured to emit a beam of light toward the optical output assembly. A connector, which includes two conductive layers separated by a dielectric layer, has a first side connected to the enclosure and a second side connected to the optical output assembly. An electrical trace disposed on the enclosure is connected to the first side of the connector so as to define a test circuit having a capacitance. Control circuitry is coupled to sense the capacitance of the test circuit, and configured to inhibit operation of the emitter upon sensing a change in the capacitance that exceeds a predetermined threshold.

20 Claims, 5 Drawing Sheets

(56) References Cited

U.S. PATENT DOCUMENTS

2017/0199144 A1 7/2017 Noble et al.
2018/0325270 A1* 11/2018 Purser ................ H03K 17/955

* cited by examiner

MINI-INTERCONNECT CAPACITOR

CROSS-REFERENCE TO RELATED APPLICATION

This application claims the benefit of U.S. Provisional Patent Application 62/819,602, filed Mar. 17, 2019, which is incorporated herein by reference.

FIELD OF THE INVENTION

The present invention relates generally to optoelectronic devices, and particularly to optical light-emitting modules.

BACKGROUND

Optical modules, comprising an emitter and a diffractive optical element (DOE), are commonly used for projecting light from portable electronic devices.

U.S. Pat. No. 10,174,931 describes an optical module with enhanced reliability and integrity. The module includes a transparent substrate and an optical output element, which is connected to the substrate by a mechanical seal. A conductive trace is deposited on the substrate beneath the mechanical seal so that the conductive trace will break upon disruption of the mechanical seal. Control circuitry is coupled to measure a resistance of the conductive trace and to inhibit operation of the optical module upon detecting, based on the resistance, that the conductive trace has broken.

United States Patent Application Document 2017/0199144 describes an optical module with a capacitive DOE integrity monitor. The module includes first and second transparent substrates and a spacer between the first and second transparent substrates, holding the first transparent substrate in proximity to the second transparent substrate, with first and second diffractive optical elements (DOEs) on respective faces of the first and second transparent substrates. At least first and second capacitance electrodes are disposed respectively on the first and second transparent substrates in proximity to the first and second DOEs. Circuitry is coupled to measure changes in a capacitance between at least the first and second capacitance electrodes.

SUMMARY

Embodiments of the present invention that are described hereinbelow provide improved optical modules and methods for manufacture and use of such modules.

There is therefore provided, in accordance with an embodiment of the invention, an optical module, including an enclosure and an optical output assembly mounted on the enclosure. An emitter mounted in the enclosure is configured to emit a beam of light toward the optical output assembly. A connector, which includes two conductive layers separated by a dielectric layer, has a first side connected to the enclosure and a second side connected to the optical output assembly. An electrical trace disposed on the enclosure is connected to the first side of the connector so as to define a test circuit having a capacitance. Control circuitry is coupled to sense the capacitance of the test circuit, and configured to inhibit operation of the emitter upon sensing a change in the capacitance that exceeds a predetermined threshold.

In a disclosed embodiment, the optical output assembly includes a diffractive optical element (DOE).

In some embodiments, the two conductive layers include a first conductive layer and a second conductive layer, wherein the first conductive layer includes a first middle part, a left edge part, and a right edge part, wherein the edge parts are positioned on two sides of the first middle part, and wherein the second conductive layer includes a second middle part, which overlaps the first and second edge parts of the first conductive layer, thus defining two capacitors within the test circuit. In a disclosed embodiment, the electrical trace on the enclosure is connected between the first and second edge parts, and the control circuitry is connected between the middle part of the second conductive layer and at least one of the edge parts of the first conductive layer. The first and second edge parts of the first conductive layer can be connected to the electrical trace on the enclosure by a conductive adhesive.

In a disclosed embodiment, the connector is configured so that a shift of the optical output assembly relative to the housing exceeding a predefined limit causes a change in the capacitance of the test circuit exceeding the predetermined threshold.

Additionally or alternatively, the optical module includes an additional capacitor coupled to the optical output assembly and connected between one of the conductive layers of the connector and the control circuitry.

In some embodiments, the two conductive layers of the connector include first and second metal layers, wherein a polymer is coated over the first metal layer to define the dielectric layer, and the second metal layer is deposited over the polymer. In one embodiment, the first metal layer includes stainless steel, the second metal layer includes copper, and the polymer includes polyimide. Additionally or alternatively, the first and second metal layers are etched to define electrodes of first and second capacitors, and the polymer layer is etched to create vias for connection to the electrodes, wherein the vias are filled by deposition of the second metal layer. Further additionally or alternatively, the connector includes a protective polymer layer, which is coated over the second metal layer.

There is also provided, in accordance with an embodiment of the invention, a method for fabricating an optical module. The method includes mounting an optical output assembly on an enclosure, and mounting an emitter in the enclosure so as to emit a beam of light toward the optical output assembly. First and second sides of a connector, which includes two conductive layers separated by a dielectric layer, are connected to the enclosure and to the optical output assembly, respectively, so that the first side of the connector contacts an electrical trace on the enclosure, thereby defining a test circuit having a capacitance. The capacitance of the test circuit is sensed, and operation of the emitter is inhibited upon sensing a change in the capacitance that exceeds a predetermined threshold.

The present invention will be more fully understood from the following detailed description of the embodiments thereof, taken together with the drawings in which:

DETAILED DESCRIPTION OF EMBODIMENTS

Portable electronic devices, such as cellular phones or tablets, commonly employ one or more integral light sources. These light sources may, for example, provide illumination for a scene recorded by a camera integrated into the device. In some applications requiring intense patterned light, the light source comprises an emitter, such as a vertical-cavity surface-emitting laser (VCSEL) or some other type of laser, emitting a beam of light through a DOE. (The terms "optical radiation" and "light" as used in the present description and in the claims refer generally to any and all of visible, infrared, and ultraviolet radiation.)

A shift of the DOE relative to the emitter may cause an undesired shift in the beam or beams of light emitted by the optical module and may permit the laser beam to escape from the module without passing through the DOE at all. A resistive trace may be used in detection of the shift, but the measurement of resistance may be compromised unintentionally by, for example, an electrical short caused by conductive epoxy used in the assembly of the module.

The embodiments of the present invention that are described herein address the above limitations so as to provide an optical module with robust detection of even small shifts of the DOE, using a novel capacitive sensing approach. The embodiments are also capable of sensing and responding to changes in capacitance due to incursion of moisture into the module, which can also compromise the performance of the DOE.

In the disclosed embodiments, a connector comprises two conductive layers separated by a dielectric layer. One side of the connector is connected to an optical assembly comprising the DOE, and the other side is connected to the enclosure of the optical module. The connector forms a capacitive part of a test circuit, which is closed by an electrical trace formed on the enclosure, for example by bonding the connector to the trace with a conductive adhesive, such as a conductive epoxy. Control circuitry senses the capacitance of the test circuit, and will inhibit operation of the emitter upon sensing a change in the capacitance that exceeds a predetermined threshold. The mechanical and electrical design of the connector ensures that the capacitance will change markedly in response to a shift of the DOE that exceeds a predetermined limit, for example due to breakage of the conductive epoxy bond, thus ensuring that the control circuitry shuts down the emitter immediately when integrity is lost.

Figure 1:
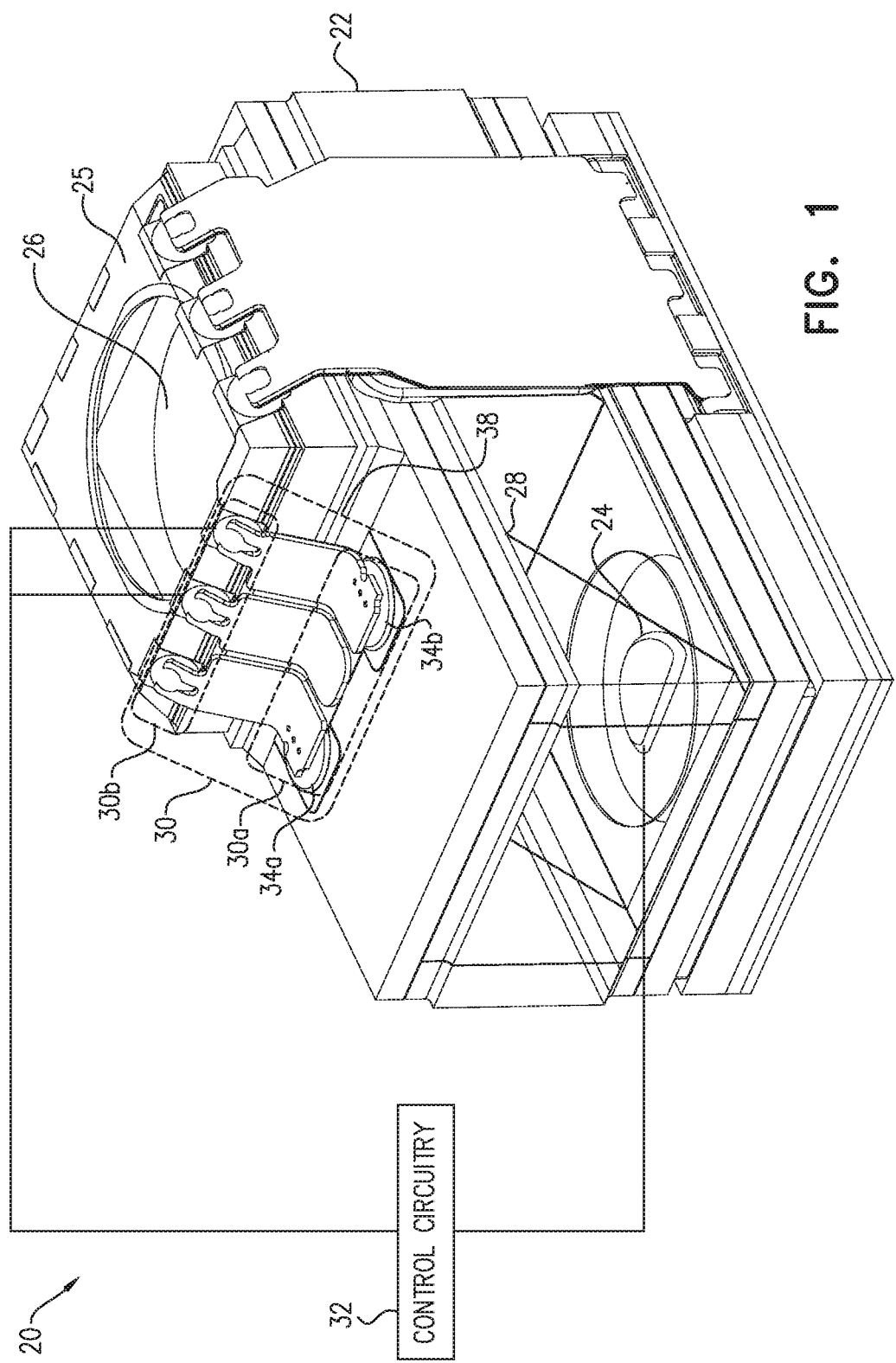
FIG. 1 is a schematic illustration of an optical module, in accordance with an embodiment of the invention.

FIG. 1 is a schematic illustration of an optical module 20, in accordance with an embodiment of the invention.

Optical module 20 comprises an enclosure 22, within which is located an emitter 24, emitting a beam of light in a vertical direction. Enclosure 22 contains optics, for example mirrors and lenses, including a mirror 28, for directing the beam towards a DOE 26 contained in an optical assembly 25, which is mounted on the enclosure. In the pictured embodiment, assembly 25 includes a single DOE, but the principles of the present invention may similarly be applied to modules that include two (or more) DOEs, such as the module mentioned above in the Background section. Optical assembly 25 may comprise a mechanical frame that holds DOE 26 as in the pictured embodiment; or alternatively, the DOE itself may constitute the entire optical assembly, without an external frame. Furthermore, although the embodiments described hereinbelow relate specifically to detecting shifts of DOE 26, the principles of the present invention may similarly be applied in detecting shifts of optical assemblies comprising optical components of other types.

A connector 30, which is configured as a mini-interconnect capacitor, straddles an interface 38 between assembly 25 and enclosure 22. A first side 30a of connector is connected to enclosure 22 by two contacts of conductive epoxy 34a and 34b, which in turn are interconnected by an electrical trace 36 (hidden under the first side in FIG. 1, but shown schematically in FIGS. 4-5) disposed on the enclosure. A second side 30b of connector 30 is connected to assembly 25. Further details of connector 30 are illustrated in FIGS. 2-5.

Electrical trace 36 is disposed on enclosure 22 by, for example, printed circuit technology or by other methods known to those skilled in the art.

Control circuitry 32 is coupled to emitter 24 and to connector 30. Control circuitry 32 typically comprises a programmable processor, which is programmed in software and/or firmware to carry out the functions that are described herein. Additionally or alternatively, at least some of the functions of control circuitry 32 may be carried out by hardware logic circuits, which may be hard-wired or programmable. In either case, control circuitry 32 has suitable interfaces for receiving and transmitting data and instructions to and from other elements of optical module 20. Although control circuitry 32 is shown in FIG. 1 as a separate block from module 20, in practice the control circuitry may be implemented, for example, in an integrated circuit chip within the module.

Figure 2:
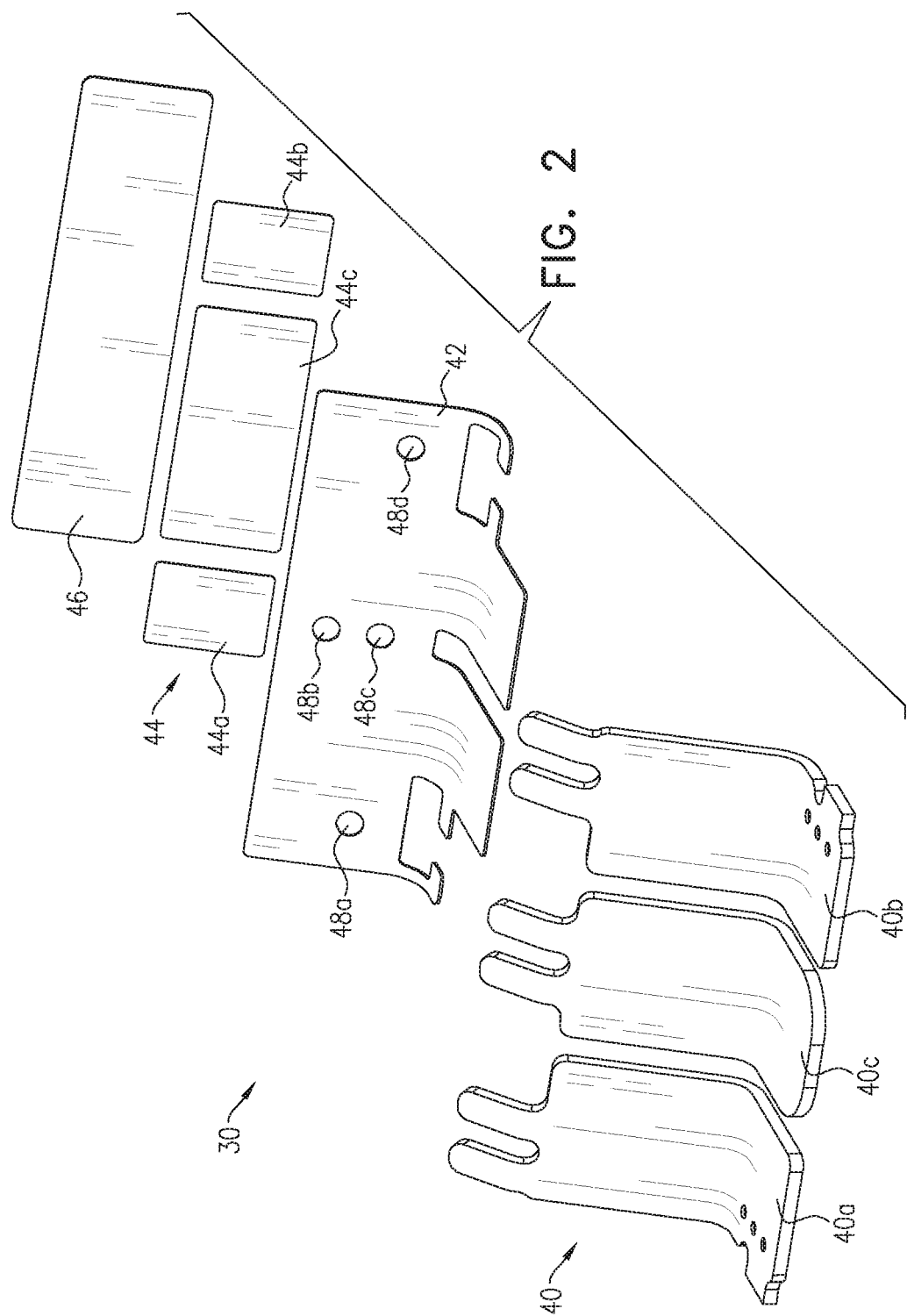
FIG. 2 is a schematic exploded illustration of a connector, in accordance with an embodiment of the invention.

FIG. 2 is a schematic exploded illustration of connector 30, in accordance with an embodiment of the invention.

Connector 30 comprises a first electrode 40, an isolating dielectric layer 42, a second electrode 44, and a protective dielectric layer 46. First electrode 40 comprises a left and a right edge part 40a and 40b, respectively, and a middle part 40c, wherein the edge parts are positioned on two sides of the middle part. In the present example, all parts of first electrode 40 are formed and etched out of a sheet of stainless steel (SST), with a typical thickness of 0.0508" (1.29 mm), but other suitable metals and dimensions may alternatively be used. Isolating dielectric layer 42 comprises a suitable polymer, such as polyimide, which is applied to and cured on first electrode 40, for example to a thickness of 0.010" (0.54 mm). Layer is similarly etched to the desired shape, including formation of vias 48a-d for providing electrical contact between first electrode 40 and second electrode 44.

Second electrode 44 comprises a left and a right edge part 44a and 44b, respectively, and a middle part 44c, wherein the edge parts are positioned on two sides of the middle part. All three parts are formed of a suitable metal, such as copper (Cu), deposited over isolating dielectric layer 42, for example to a thickness of 0.005" (0.127 mm), which is etched to separate parts 44a and 44b from part 44c. The deposited Cu also enters into vias 48a-d, connecting parts 44a-c of second electrode electrically to respective parts 40a-c of first electrode 40. In this example, protective dielectric layer 46 also comprises a polymer, such as polyimide, which is similarly deposited over second electrode 44, on the side opposite to isolating dielectric layer 42, to a typical thickness of 0.007" (0.178 mm).

The sizes, shapes and thicknesses of the parts of connector 30, and thus the capacitances between the parts of the electrodes, are determined by the deposition and etching processes.

Figure 3:
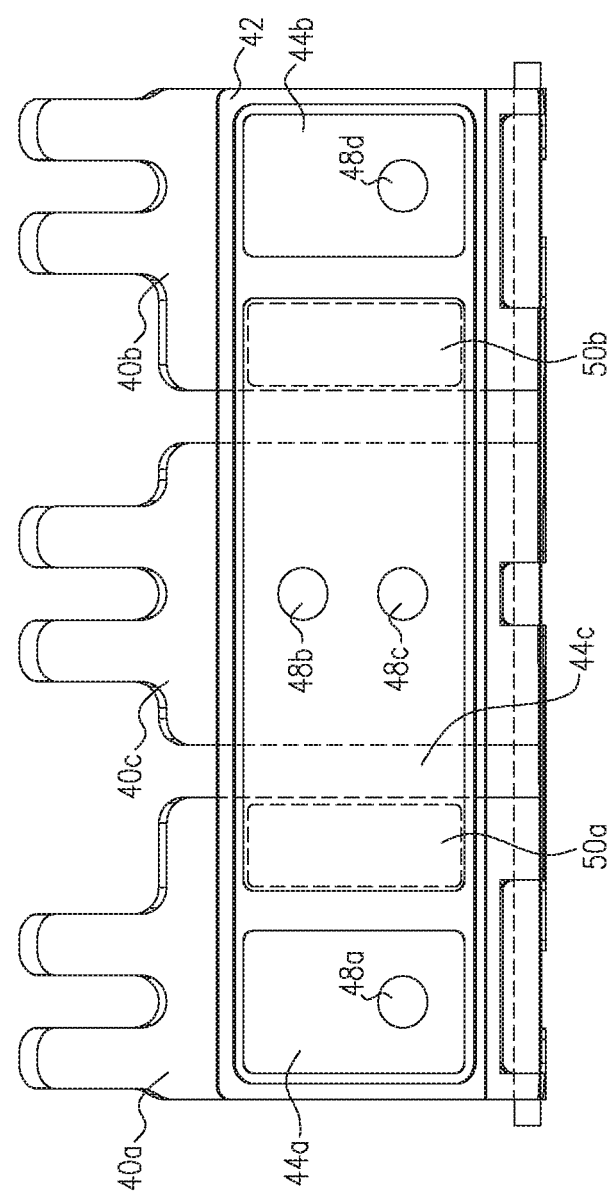
FIG. 3 is a schematic frontal view of the connector of FIG. 2.

FIG. 3 is a schematic frontal view of connector 30, in accordance with an embodiment of the invention.

For the purpose of illustration and to enhance the understanding of the figure, first electrode 40 and isolating dielectric layer 42 are shown as if they were partially transparent. Vias 48*a*-*d* are now shown filled with Cu of second electrode 44. The overlap of left edge part 40*a* of first electrode 40 and middle part 44*c* of second electrode 44 defines an area 50*a* in which a capacitance $C_a$ is formed between parts 40*a* and 44*c*. Similarly, the overlap of right edge part 40*b* of first electrode 40 and middle part 44*c* of second electrode 44 defines an area 50*b* in which a capacitance $C_b$ is formed between parts 40*b* and 44*c*. As the Cu-fill of vias 48*b* and 48*c* electrically connects middle part 40*c* of first electrode 40 and middle part 44*c* of second electrode 44, capacitances $C_a$ and $C_b$ are electrically coupled between parts 40*a* and 40*c* and between parts 40*b* and 40*c*, respectively.

The terms "left" and "right" are used for the sake of illustration only, and may be replaced by other suitable terms, such as "first" and "second."

Figure 4:
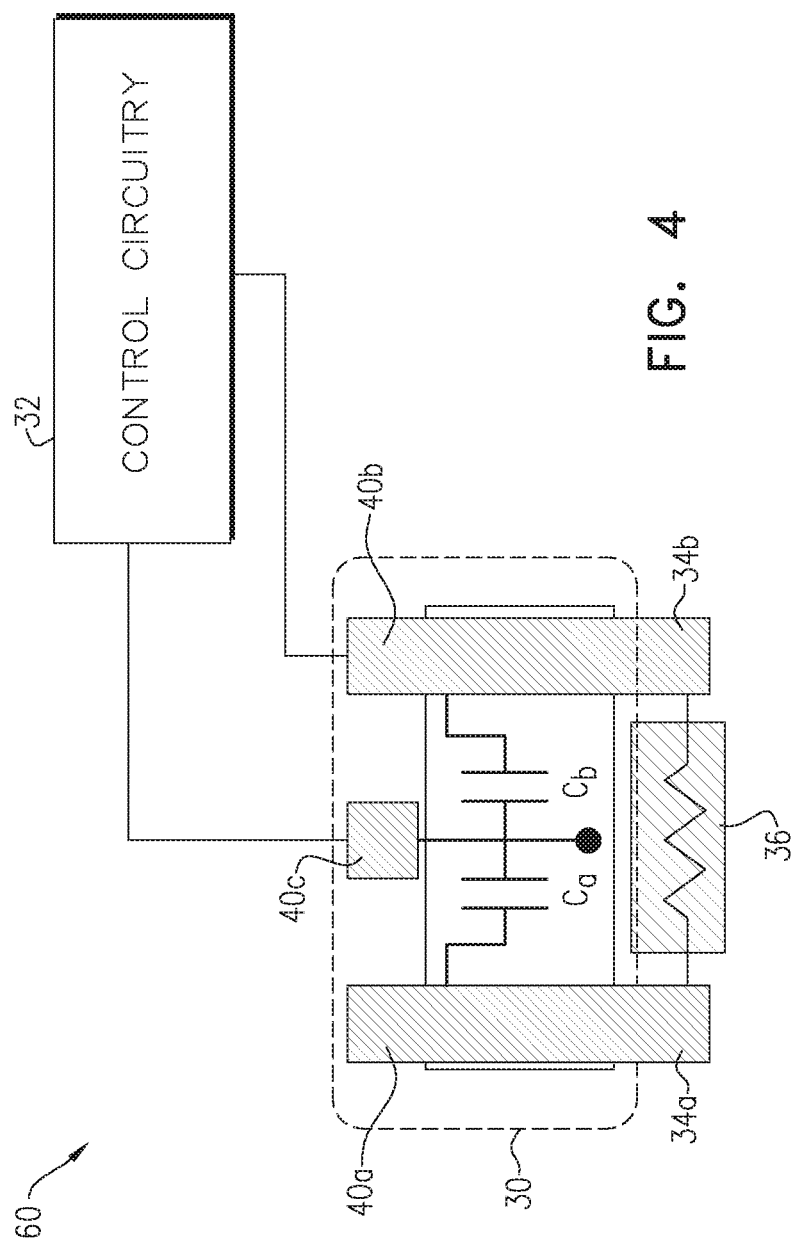
FIG. 4 is a schematic electrical diagram of a test circuit, in accordance with an embodiment of the invention.

FIG. 4 is a schematic electrical diagram of a test circuit 60, in accordance with an embodiment of the invention.

Test circuit 60 comprises the mini-interconnect capacitor defined by connector 30, electrical trace 36, and conductive epoxy contacts 34*a* and 34*b*. With reference to FIGS. 1 and 3, capacitance $C_a$ is electrically coupled between left edge part 40*a* and middle part 40*c* of first electrode 40. Similarly, capacitance $C_b$ is electrically coupled between right edge part 40*b* and middle part 40*c* of first electrode 40. Control circuitry 32 is coupled to right edge part 40*b* and to middle part 40*c* to measure the capacitance between the two parts. Edge parts 40*a* and 40*b* are coupled, via conductive epoxy contacts 34*a* and 34*b*, respectively, to electrical trace 36.

Ignoring for the sake of simplicity the electrical resistances of conductive epoxy contacts 34*a* and 34*b* and electrical trace 36, a capacitance $C_1$ measured by control circuitry 32 for an intact test circuit 60 (contacts 34*a* and 34*b* intact) is $C_1=C_a+C_b$. However, the mechanical structure of connector 30 is configured so that a movement of DOE 26 that exceeds a given predetermined threshold, such as for example 100 microns, breaks the contact between electrical trace 36 and one or both of conductive epoxy contacts 34*a* and 34*b*. Once one or both contacts have been broken, control circuitry 32 sees only a capacitance $C_2=C_b$. Control circuitry 32 is configured so that when it senses a change $\Delta C$ in the measured capacitance that exceeds a predetermined threshold, it will inhibit the operation of emitter 24.

Figure 5:
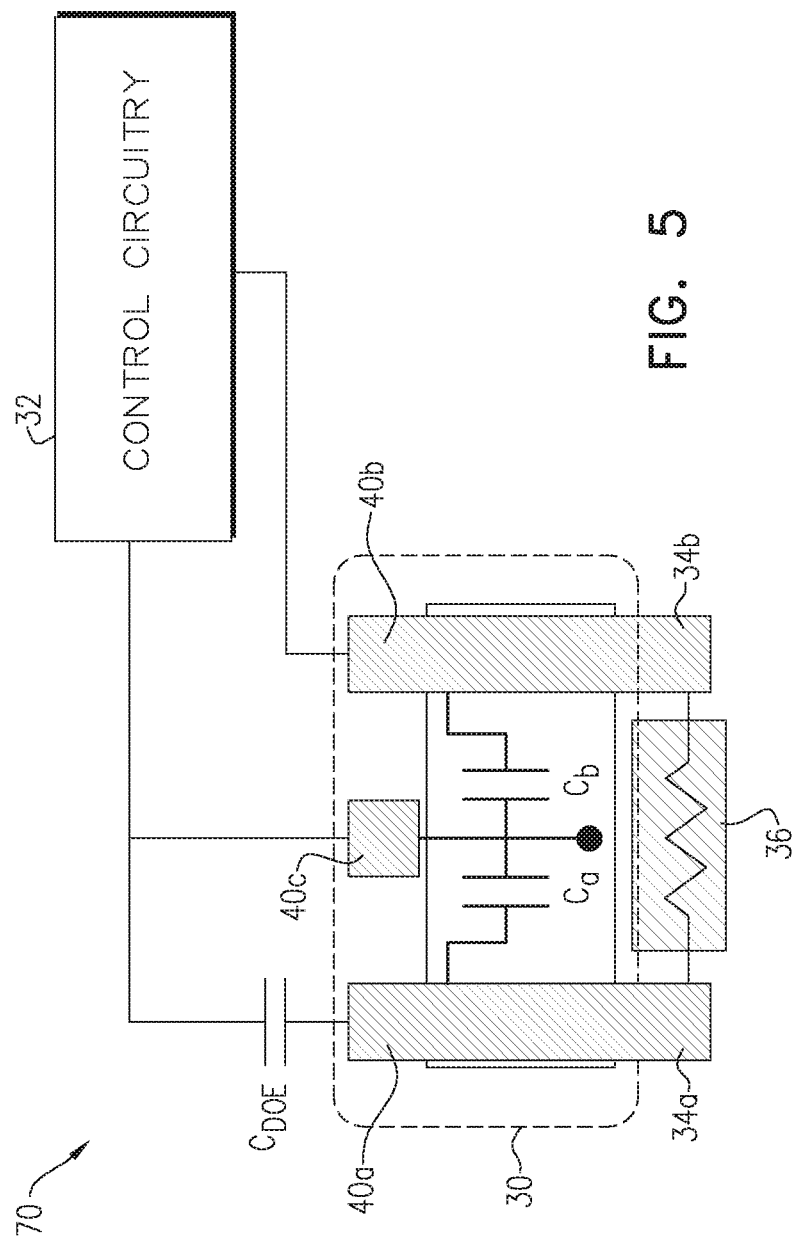
FIG. 5 is a schematic electrical diagram of a test circuit, in accordance with another embodiment of the invention.

FIG. 5 is a schematic electrical diagram of a test circuit 70, in accordance with another embodiment of the invention. Test circuit 70 is identical to test circuit 60 (FIG. 4), with the addition of a third capacitance $C_{DOE}$ of DOE 26 coupled between left edge part 40*a* of first electrode 40 and control circuitry 32. Details of how this capacitance $C_{DOE}$ can be applied to the DOE are described, for example, in the above-referenced United States Patent Application Document 2017/0199144.

When conductive epoxy contacts 34*a* and 34*b* are intact, control circuitry 32 measures a capacitance due to the combines effects of $C_a$, $C_b$ and $C_{DOE}$. As in FIG. 4, a movement of DOE 26 that exceeds a given predetermined threshold breaks the contact between electrical trace 36 and one or both of conductive epoxy contacts 34*a* and 34*b*, thus changing sharply the capacitance sensed by control circuitry 32. Including capacitance $C_{DOE}$ in test circuit 70 provides an additional measurement reference, and can also cause control circuitry 32 to respond to changes in $C_{DOE}$ itself.

Again, as in FIG. 4, control circuitry 32 is configured so that when it senses a change in the measured capacitance that exceeds a predetermined threshold it will inhibit the operation of emitter 24. Furthermore, the pictured configuration provides enhanced sensitivity to shifts of DOE 26 in all possible shift directions.

The present embodiments are also advantageous in ensuring that the initial assembly of module 20 has been properly carried out. Successful mechanical and electrical assembly of connector 30 to module 20 will result in the capacitance measured by control circuitry 32 to increase by a predictable amount (for example, $C_1=C_a+C_b$). Checking the capacitance thus provides a test for successful module assembly and screens for any faults that would result in a compromised module. A passive connector, without intrinsic capacitance, does not provide this sort of robust test of successful assembly.

Although the figures show certain interconnection schemes between the mini-interconnect capacitor of connector 30 and the test circuit and control circuitry, other schemes that may be used to make measurements of this sort and detect loss of integrity on this basis will be apparent to those skilled in the art after reading the above description and are considered to be within the scope of the present invention. Moreover, capacitors formed by the methods described above can be used in other sorts of connectors in applications in which sensitive detection of disconnection and loss of integrity are required.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optical module, comprising:
   an enclosure;
   an optical output assembly mounted on the enclosure;
   an emitter mounted in the enclosure and configured to emit a beam of light toward the optical output assembly;
   a connector, which comprises two conductive layers separated by a dielectric layer, and which has a first side connected to the enclosure and a second side connected to the optical output assembly;
   an electrical trace disposed on the enclosure and connected to the first side of the connector so as to define a test circuit having a capacitance; and
   control circuitry coupled to sense the capacitance of the test circuit, and configured to inhibit operation of the emitter upon sensing a change in the capacitance that exceeds a predetermined threshold.

2. The optical module according to claim 1, wherein the optical output assembly comprises a diffractive optical element (DOE).

3. The optical module according to claim 1, wherein the two conductive layers comprise a first conductive layer and a second conductive layer,
   wherein the first conductive layer comprises a first middle part, a left edge part, and a right edge part, wherein the edge parts are positioned on two sides of the first middle part, and
   wherein the second conductive layer comprises a second middle part, which overlaps the first and second edge parts of the first conductive layer, thus defining two capacitors within the test circuit.

4. The optical module according to claim 3, wherein the electrical trace on the enclosure is connected between the first and second edge parts, and wherein the control circuitry is connected between the middle part of the second conductive layer and at least one of the edge parts of the first conductive layer.

5. The optical module according to claim 4, wherein the first and second edge parts of the first conductive layer are connected to the electrical trace on the enclosure by a conductive adhesive.

6. The optical module according to claim 1, wherein the connector is configured so that a shift of the optical output assembly relative to the enclosure exceeding a predefined limit causes a change in the capacitance of the test circuit exceeding the predetermined threshold.

7. The optical module according to claim 1, and comprising an additional capacitor coupled to the optical output assembly and connected between one of the conductive layers of the connector and the control circuitry.

8. The optical module according to claim 1, wherein the two conductive layers of the connector comprise first and second metal layers, wherein a polymer is coated over the first metal layer to define the dielectric layer, and the second metal layer is deposited over the polymer.

9. The optical module according to claim 8, wherein the first metal layer comprises stainless steel, the second metal layer comprises copper, and the polymer comprises polyimide.

10. The optical module according to claim 8, wherein the first and second metal layers are etched to define electrodes of first and second capacitors, and the polymer is etched to create vias for connection to the electrodes, wherein the vias are filled by deposition of the second metal layer.

11. The optical module according to claim 8, wherein the connector comprises a protective polymer layer, which is coated over the second metal layer.

12. A method for fabricating an optical module, the method comprising:
mounting an optical output assembly on an enclosure;
mounting an emitter in the enclosure so as to emit a beam of light toward the optical output assembly;
connecting first and second sides of a connector, which comprises two conductive layers separated by a dielectric layer, to the enclosure and to the optical output assembly, respectively, so that the first side of the connector contacts an electrical trace on the enclosure, thereby defining a test circuit having a capacitance; and
sensing the capacitance of the test circuit, and inhibiting operation of the emitter upon sensing a change in the capacitance that exceeds a predetermined threshold.

13. The method according to claim 12, wherein the optical output assembly comprises a diffractive optical element (DOE).

14. The method according to claim 12, wherein the two conductive layers comprise a first conductive layer and a second conductive layer,
wherein the first conductive layer comprises a first middle part, a left edge part, and a right edge part, wherein the edge parts are positioned on two sides of the first middle part, and
wherein the second conductive layer comprises a second middle part, which overlaps the first and second edge parts of the first conductive layer, thus defining two capacitors within the test circuit.

15. The method according to claim 14, wherein the electrical trace on the enclosure is connected between the first and second edge parts, and
wherein sensing the capacitance comprises measuring the capacitance between the middle part of the second conductive layer and at least one of the edge parts of the first conductive layer.

16. The method according to claim 12, wherein connecting the first and second sides of the connector comprises configuring the connector so that a shift of the optical output assembly relative to the housing exceeding a predefined limit causes a change in the capacitance of the test circuit exceeding the predetermined threshold.

17. The method according to claim 12, wherein the two conductive layers of the connector comprise first and second metal layers, wherein a polymer is coated over the first metal layer to define the dielectric layer, and the second metal layer is deposited over the polymer.

18. The method according to claim 17, wherein the first metal layer comprises stainless steel, the second metal layer comprises copper, and the polymer comprises polyimide.

19. The method according to claim 17, wherein the first and second metal layers are etched to define electrodes of first and second capacitors, and the polymer layer is etched to create vias for connection to the electrodes, wherein the vias are filled by deposition of the second metal layer.

20. The method according to claim 17, wherein the connector comprises a protective polymer layer, which is coated over the second metal layer.

* * * * *